(12) United States Patent
Bao et al.

(10) Patent No.: US 12,288,516 B2
(45) Date of Patent: Apr. 29, 2025

(54) DISPLAY MODULE AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Wenchao Bao, Beijing (CN); Yue Wu, Beijing (CN); Huihui Li, Beijing (CN); Miao Liu, Beijing (CN); Cheng Xu, Beijing (CN); Jingbo Xu, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/257,385

(22) PCT Filed: Jun. 24, 2022

(86) PCT No.: PCT/CN2022/101281
§ 371 (c)(1),
(2) Date: Jun. 14, 2023

(87) PCT Pub. No.: WO2023/245663
PCT Pub. Date: Dec. 28, 2023

(65) Prior Publication Data
US 2024/0321195 A1    Sep. 26, 2024

(51) Int. Cl.
*G09G 3/3225*    (2016.01)
*G02F 1/1345*    (2006.01)
(Continued)

(52) U.S. Cl.
CPC ....... *G09G 3/3225* (2013.01); *G02F 1/13452* (2013.01); *G09G 3/32* (2013.01);
(Continued)

(58) Field of Classification Search
CPC ...... G09G 3/3225; G09G 3/32; G09G 3/3648; G09G 2300/0426; G09G 2310/0291;
(Continued)

(56) References Cited

U.S. PATENT DOCUMENTS 7,187,710 B1    3/2007  Fulkerson
2003/0151055 A1    8/2003  Tsuji et al.
(Continued)

FOREIGN PATENT DOCUMENTS

CN    103378846 A    10/2013
CN    208572265 U    3/2019
(Continued)

*Primary Examiner* — Grant Sitta
(74) *Attorney, Agent, or Firm* — Dority & Manning, P.A.

(57) ABSTRACT

A display module includes a display panel, at least one bonding circuit board, a plurality of chip-on-films, and a plurality of buffer devices. The at least one bonding circuit board each include first differential lines, and a first differential line includes a P-polarity differential sub-line and an N-polarity differential sub-line. An end of a chip-on-film is connected to the first differential line, and the other end of the chip-on-film is connected to the display panel. The buffer devices are arranged on the bonding circuit board, a buffer device is connected to ends, proximate to the chip-on-film, of the P-polarity differential sub-line and the N-polarity differential sub-line, and the buffer device is configured to reduce signal reflection between the first differential line and the chip-on-film.

20 Claims, 8 Drawing Sheets

(51) Int. Cl.
*G09G 3/32* (2016.01)
*G09G 3/36* (2006.01)
*H10K 59/126* (2023.01)
*H10K 59/131* (2023.01)

(52) U.S. Cl.
CPC ......... *G09G 3/3648* (2013.01); *H10K 59/126* (2023.02); *H10K 59/131* (2023.02); *G09G 2300/0426* (2013.01); *G09G 2310/0291* (2013.01); *G09G 2320/0219* (2013.01); *G09G 2370/14* (2013.01)

(58) Field of Classification Search
CPC ....... G09G 2320/0219; G09G 2370/14; G09G 3/30; G09G 3/36; G02F 1/13452; H10K 59/126; H10K 59/131
See application file for complete search history.

(56) References Cited

U.S. PATENT DOCUMENTS

| | | | |
|---|---|---|---|
| 2018/0181357 A1 | 6/2018 | Chang | |
| 2021/0097939 A1* | 4/2021 | Chae | G09G 3/3688 |
| 2022/0076625 A1* | 3/2022 | Lee | G09G 3/3233 |

FOREIGN PATENT DOCUMENTS

| | | | |
|---|---|---|---|
| CN | 112992079 A | 6/2021 | |
| CN | 113539194 A | 10/2021 | |
| CN | 113724592 A | 11/2021 | |
| CN | 114283729 A | 4/2022 | |
| JP | 2020022073 A | 2/2020 | |

\* cited by examiner

DISPLAY MODULE AND DISPLAY DEVICE

CROSS-REFERENCE TO RELATED APPLICATION

This application is a national phase entry under 35 USC 371 of International Patent Application No. PCT/CN2022/101281 filed on Jun. 24, 2022, which is incorporated herein by reference in its entirety.

TECHNICAL FIELD

The present disclosure relates to the field of display technologies, and in particular, to a display module and a display device.

BACKGROUND

With the development of display technologies, large-sized display devices (such as televisions) have received increasing attention. For a large-sized display device (such as 70 inches or larger), a length of a signal transmission line is correspondingly longer, and the requirements of the display device on the accuracy and reliability of signals transmitted by the signal transmission line are higher.

SUMMARY

In an aspect, a display module is provided. The display module includes a display panel, at least one bonding circuit board, a plurality of chip-on-films, and a plurality of buffer devices. The at least one bonding circuit board each include first differential lines, where a first differential line includes a P-polarity differential sub-line and an N-polarity differential sub-line. An end of a chip-on-film is connected to the first differential line, and the other end of the chip-on-film is connected to the display panel. The plurality of buffer devices are arranged on the bonding circuit board, where a buffer device is connected to ends, proximate to the chip-on-film, of the P-polarity differential sub-line and the N-polarity differential sub-line, and the buffer device is configured to reduce signal reflection between the first differential line and the chip-on-film.

In some embodiments, the buffer device includes a first resistor, an end of the first resistor is connected to the P-polarity differential sub-line, and the other end of the first resistor is connected to the N-polarity differential sub-line.

In some embodiments, a resistance of the first resistor is substantially equal to an impedance of the first differential line.

In some embodiments, a value of a resistance of the first resistor is 100 ohms ($\Omega$).

In some embodiments, the first resistor includes a chip resistor, and a package size of the chip resistor is less than or equal to a 0402 package size.

In some embodiments, the buffer device includes a low-voltage differential signaling (LVDS) buffer, and the LVDS buffer includes a first input terminal, a second input terminal, a first output terminal and a second output terminal; the chip-on-film is connected to the first differential line through the LVDS buffer. The first input terminal is connected to the P-polarity differential sub-line, the second input terminal is connected to the N-polarity differential sub-line, and the first output terminal and the second output terminal are connected to the chip-on-film.

In some embodiments, a distance between the P-polarity differential sub-line and the N-polarity differential sub-line is less than or equal to a line width of each of the P-polarity differential sub-line and the N-polarity differential sub-line.

In some embodiments, the chip-on-film includes a low-voltage differential signaling (LVDS) interface circuit, the LVDS interface circuit includes a first signal receiving terminal, a second signal receiving terminal, a signal output terminal and a second resistor. The first signal receiving terminal is connected to the P-polarity differential sub-line, the second signal receiving terminal is connected to the N-polarity differential sub-line, and the signal output terminal is connected to the display panel; an end of the second resistor is connected to the first signal receiving terminal, and the other end of the second resistor is connected to the second signal receiving terminal.

In some embodiments, a resistance of the second resistor is substantially equal to an impedance of the first differential line; and the second resistor includes two sub-resistors connected in series, and resistances of the two sub-resistors are equal.

In some embodiments, the display module includes a plurality of bonding circuit boards, the plurality of bonding circuit boards are arranged at intervals along a first direction. The display module further includes a driving circuit board and a plurality of flexible connectors. The driving circuit board is configured to output differential signals. Each bonding circuit board is connected to the driving circuit board through one or more flexible connectors. The plurality of flexible connectors each include a wiring layer, the wiring layer includes second differential lines, an end of a second differential line is connected to the driving circuit board, and the other end of the second differential line is connected to the first differential line. The first direction is parallel to a side edge of the display panel where the plurality of bonding circuit boards are located.

In some embodiments, in at least one flexible connector, each flexible connector further includes: at least one shielding layer, arranged on at least one side of a wiring layer included in the flexible connector along a thickness direction of the wiring layer, where the shielding layer covers second differential lines included in the wiring layer.

In some embodiments, another at least one flexible connector each are not provided with a shielding layer therein, and a length of a flexible connector provided with a shielding layer is greater than a length of a flexible connector not provided with a shielding layer.

In some embodiments, a dimension, along the first direction, of the driving circuit board is greater than a distance, along the first direction, between two bonding circuit boards of the plurality of bonding circuit boards at both ends; along a second direction, at least a portion of each bonding circuit board is opposite to the driving circuit board; and the portion of each bonding circuit board opposite to the driving circuit board is connected to the driving circuit board through the one or more flexible connectors. The first direction is perpendicular to the second direction.

In some embodiments, lengths of the plurality of flexible connectors are substantially equal.

In some embodiments, an extension direction of a length of the flexible connector is substantially parallel to the second direction.

In some embodiments, the driving circuit board includes a main body portion and extension portions located at two opposite sides of the main body portion along the first direction, and dimensions of the extension portions along the second direction each are less than a dimension of the main body portion along the second direction; and the driving circuit board further includes a timing controller, arranged on the main body portion and configured to output the differential signals.

In some embodiments, the plurality of bonding circuit boards include a first bonding circuit board and a second bonding circuit board arranged adjacent to each other; along a second direction, at least a portion of the first bonding circuit board is opposite to the driving circuit board, and the second bonding circuit board is staggered from the driving circuit board. The plurality of flexible connectors include a first flexible connector, a second flexible connector, and a third first flexible connector. The first direction is perpendicular to the second direction.

The first bonding circuit board is connected to the driving circuit board through the first flexible connector and the second flexible connector; the first flexible connector is configured to transmit a differential signal required by a chip-on-film connected to the first bonding circuit board, and the second flexible connector is configured to transmit a differential signal required by a chip-on-film connected to the second bonding circuit board. An end of a third flexible connector is connected to the first bonding circuit board, and the other end of the third flexible connector is connected to the second bonding circuit board; and the differential signal transmitted by the second flexible connector is transmitted to the second bonding circuit board through the first bonding circuit board and the third flexible connector in sequence.

In some embodiments, the first bonding circuit board includes the first differential line and a first transition line, and the third flexible connector includes a second transition line. An end of the first differential line is connected to the first flexible connector, and the other end of the first differential line is connected to the chip-on-film connected to the first bonding circuit board. An end of the first transition line is connected to the second flexible connector, and the other end of the first transition line is connected to the second transition line.

In some embodiments, the plurality of bonding circuit boards further include a third bonding circuit board arranged adjacent to the second bonding circuit board, and the third bonding circuit board is located on a side of the second bonding circuit board away from the first bonding circuit board; along the second direction, the third bonding circuit board is staggered with the driving circuit board.

The plurality of flexible connectors further include a fourth flexible connector and a fifth flexible connector. An end of the fourth flexible connector is connected to the first bonding circuit board, and the other end of the fourth flexible connector is connected to the driving circuit board; the fourth flexible connector is configured to transmit a differential signal required by a chip-on-film connected to the third bonding circuit board. An end of the fifth flexible connector is connected to the second bonding circuit board, and the other end of the fifth flexible connector is connected to the third bonding circuit board; the differential signal transmitted by the fourth flexible connector is transmitted to the third bonding circuit board through the first bonding circuit board, the third flexible connector, the second bonding circuit board and the fifth flexible connector in sequence.

In some embodiments, the first bonding circuit board includes a third transition line, the third flexible connector includes a fourth transition line, the second bonding circuit board includes a fifth transition line, and the fifth flexible connector includes a sixth transition line. The third transition line, the fourth transition line, the fifth transition line and the sixth transition line are connected in sequence, the third transition line is further connected to the fourth flexible connector, and the sixth transition line is further connected to the third bonding circuit board.

In some embodiments, a length of the first flexible connector is equal to a length of the second flexible connector, and/or an extension direction of the length of the first flexible connector and an extension direction of the length of the second flexible connector are substantially parallel to the second direction.

In a case where the display module further includes a fourth flexible connector, the length of the first flexible connector, the length of the second flexible connector, and a length of the fourth flexible connector are equal, and/or the extension direction of the length of the first flexible connector, the extension direction of the length of the second flexible connector, and an extension direction of the length of the fourth flexible connector are substantially parallel to the second direction.

In some embodiments, the display module includes a plurality of first bonding circuit boards, a plurality of second bonding circuit boards, a plurality of first flexible connectors, a plurality of second flexible connectors, and a plurality of third flexible connectors; the plurality of first bonding circuit boards are symmetrically arranged with respect to a center line of the display panel along a second direction, the plurality of second bonding circuit boards are symmetrically arranged with respect to the center line of the display panel along the second direction, the plurality of first flexible connectors are symmetrically arranged with respect to the center line of the display panel along the second direction, the plurality of second flexible connectors are symmetrically arranged with respect to the center line of the display panel along the second direction, and the plurality of third flexible connectors are symmetrically arranged with respect to the center line of the display panel along the second direction; the first direction is perpendicular to the second direction. In a case where the display module further includes a plurality of third bonding circuit board, a plurality of fourth flexible connector, and a plurality of fifth flexible connector, the plurality of third bonding circuit board are symmetrically arranged with respect to the center line of the display panel along the second direction, the plurality of fourth flexible connector are symmetrically arranged with respect to the center line of the display panel along the second direction, and the plurality of fifth flexible connector are symmetrically arranged with respect to the center line of the display panel along the second direction.

In some embodiments, the plurality of flexible connectors further include a plurality of sixth flexible connectors, and each bonding circuit board is connected to the driving circuit board through a sixth flexible connector; the sixth flexible connector is configured to transmit a power signal.

In another aspect, a display device is provided. The display device includes the display module as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person having ordinary skill in the art can obtain other drawings according to these accompanying drawings. In addition, the accompanying drawings to be described below may be regarded as schematic diagrams, and are not limitations on an actual size of a product, an actual process of a method and an actual timing of a signal involved in embodiments of the present disclosure.

DETAILED DESCRIPTION

Figure 1:
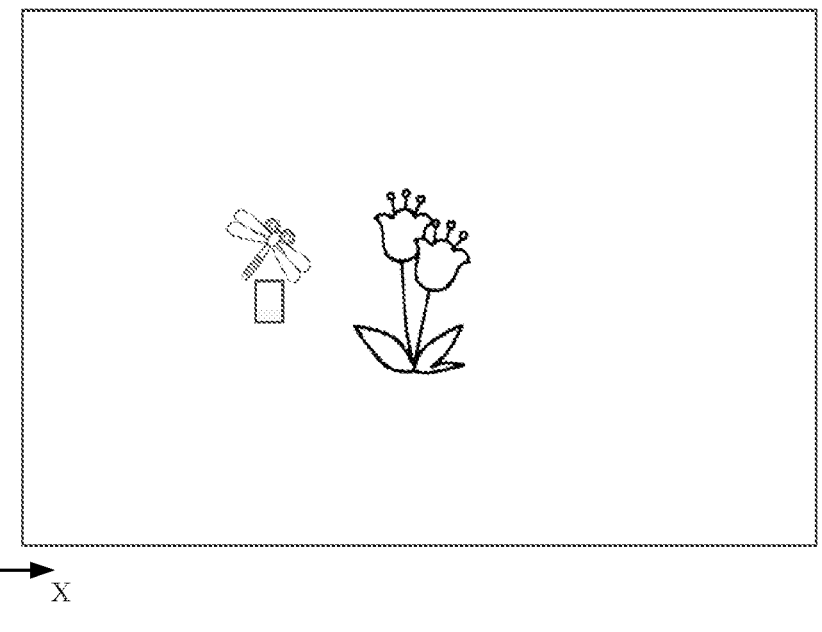
FIG. 1 is a structural diagram of a display device, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person having ordinary skill in the art based on embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a/the plurality of" mean two or more unless otherwise specified.

In the description of some embodiments, the terms "connected to," "connected with" and derivatives thereof may be used. For example, the term "connected to" may be used in the description of some embodiments to indicate that two or more components are in direct physical contact or electrical contact with each other.

The phrase "A and/or B" includes the following three combinations: only A, only B, and a combination of A and B.

The use of the phrase "configured to" herein means an open and inclusive expression, which does not exclude devices that are adapted to or configured to perform additional tasks or steps.

As used herein, the term such as "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

The terms "parallel", "perpendicular" and "equal" as used herein include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

Exemplary embodiments are described herein with reference to sectional views and/or plan views that are schematic illustrations of idealized embodiments. In the accompanying drawings, thicknesses of layers and regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display device 1000. Referring to FIG. 1, the display device 1000 may be any device that can display images whether in motion (e.g., a video) or stationary (e.g., a still image), and regardless of text or image. The display device 1000 may be, for example, any product or component having a display function, such as a television, a notebook computer, a tablet computer, a mobile phone, an electronic photo, an electronic billboard or sign, a personal digital assistant (PDA), a navigator, a wearable device, an augmented reality (AR) device, a virtual reality (VR) device, or the like.

In some embodiments, the display device 1000 may be a liquid crystal display (LCD) device; alternatively, the display device 1000 may be an electroluminescence display device or a photoluminescence display device. In a case where the display device 1000 is an electroluminescent display device, the electroluminescent display device may be an organic electroluminescent display device (organic light-emitting diode display device, OLED display device) or a quantum dot electroluminescent display device (quantum dot light-emitting diode display device, QLED display device). In a case where the display device 1000 is a photoluminescence display device, the photoluminescence display device may be a quantum photoluminescence display device (quantum dot light-emitting display device, QLED display device). The type of the display device 1000 is not limited in embodiments of the present disclosure.

Figure 2:
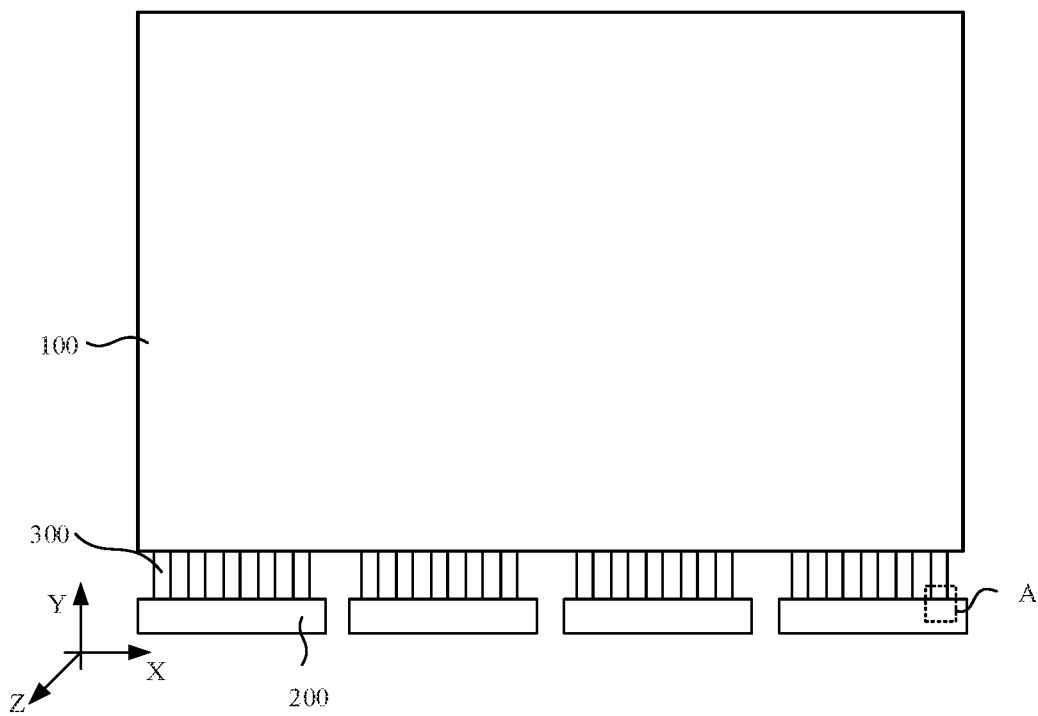
FIG. 2 is a structural diagram of a display module, in accordance with some embodiments.
Figure 3:
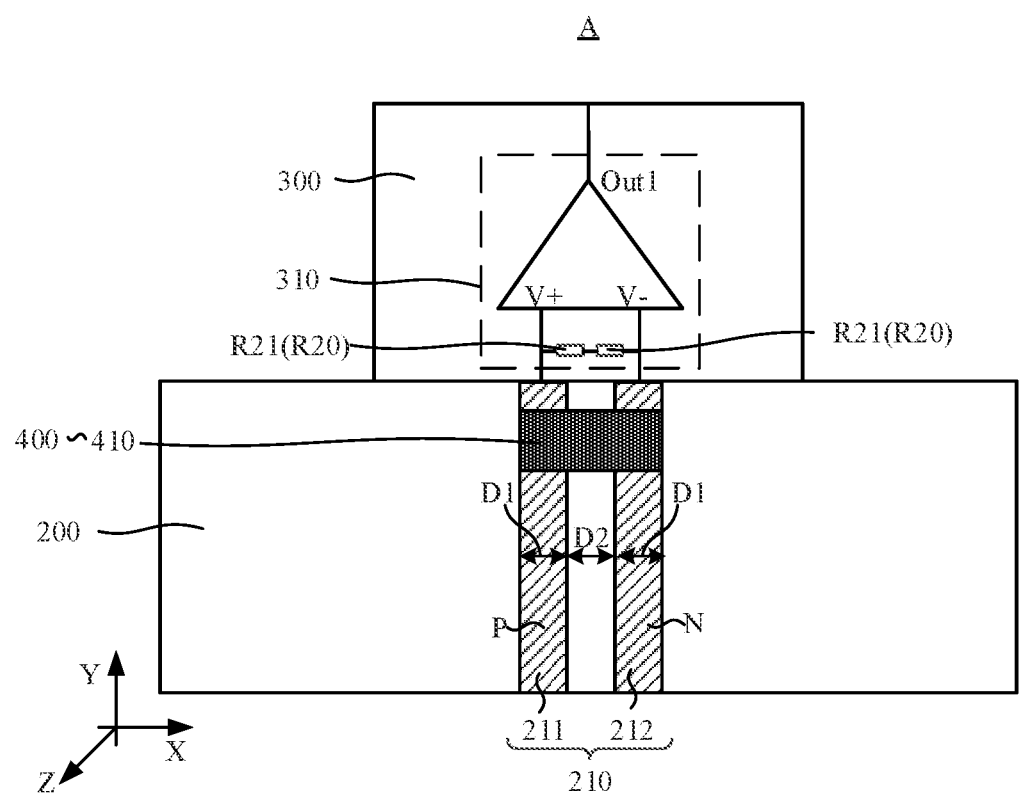
FIG. 3 is a partial enlargement view of the region A in FIG. 2.

Referring to FIGS. 2 and 3, the display device 1000 includes a display module 1100. The display module 1100 includes a display panel 100, bonding circuit board(s) (X-printed circuit board, XPCB) 200, chip-on-films (COF) 300, and buffer devices 400 (as shown in FIG. 3). FIG. 3 shows an example in which the buffer device 400 are each a first resistor 410.

The display panel 100 may be, for example, one of an LCD display panel, an OLED display panel, and a QLED display panel. The embodiments of the present disclosure do not specifically limit the type and structure of the display panel 100.

The bonding circuit boards 200 are located at a side of the display panel 100. For example, a bonding circuit board 200 may include various signal connection lines, the signal connection lines are configured to transmit external signals (such as power signals, gate on array (GOA) signals, clock control signals, etc.) to the display panel 100 through chip-on-films 300, so as to control the display panel 100 to display images.

In some embodiments, referring to FIG. 3, the bonding circuit board 200 includes first differential lines 210, and the first differential line 210 includes a P-polarity differential sub-line 211 and an N-polarity differential sub-line 212. The first differential line 210 may be used to transmit a differential signal. For example, the differential signal may be a clock embedded differential signal (CEDS).

Referring to FIGS. 2 and 3, an end of the chip-on-film 300 is connected to the bonding circuit board 200 and connected to the first differential line 210, and the other end is connected to the display panel 100.

In some embodiments, referring to FIG. 3, the chip-on-film 300 includes a low-voltage differential signaling (LVDS) interface circuit 310, and the LVDS interface circuit 310 includes a first signal receiving terminal V+, a second signal receiving terminal V−, a signal output terminal Out1 and a second resistor R20.

For example, the LVDS interface circuit 310 is connected to the first differential line 210, and specifically, it may be arranged as follows: the first signal receiving terminal V+ is connected to the P-polarity differential sub-line 211 of the first differential line 210, the second signal receiving terminal V− is connected to the N-polarity differential sub-line 212 of the first differential line 210, the signal output terminal Out1 is configured to be connected to the display panel 100, an end of the second resistor R20 is connected to the first signal receiving terminal V+, and the other end is connected to the second signal receiving terminal V−.

In the related art, the chip-on-film 300 serves as a signal receiving terminal during a transmission of the differential signal from the first differential line 210 to the chip-on-film 300. An impedance of the first differential line 210 is less than an impedance of the chip-on-film 300. For example, the impedance of the first differential line 210 may be set to 100 ohms (Ω), while the impedance of the chip-on-film 300 is greater than 100Ω. Thus, for the differential signal, the chip-on-film 300 is a high impedance circuit, and when the differential signal is transmitted from the first differential line 210 to the chip-on-film 300, this process is equivalent to that the differential signal jumps from 1000 to a high impedance, which may cause the differential signal to generate signal reflection at an end of the first differential line 210 connected to the chip-on-film 300, and further cause the chip-on-film 300 not to receive the differential signal, or erroneously identify the differential signal, which may cause the display panel 100 to generate a poor display.

Figure 4:
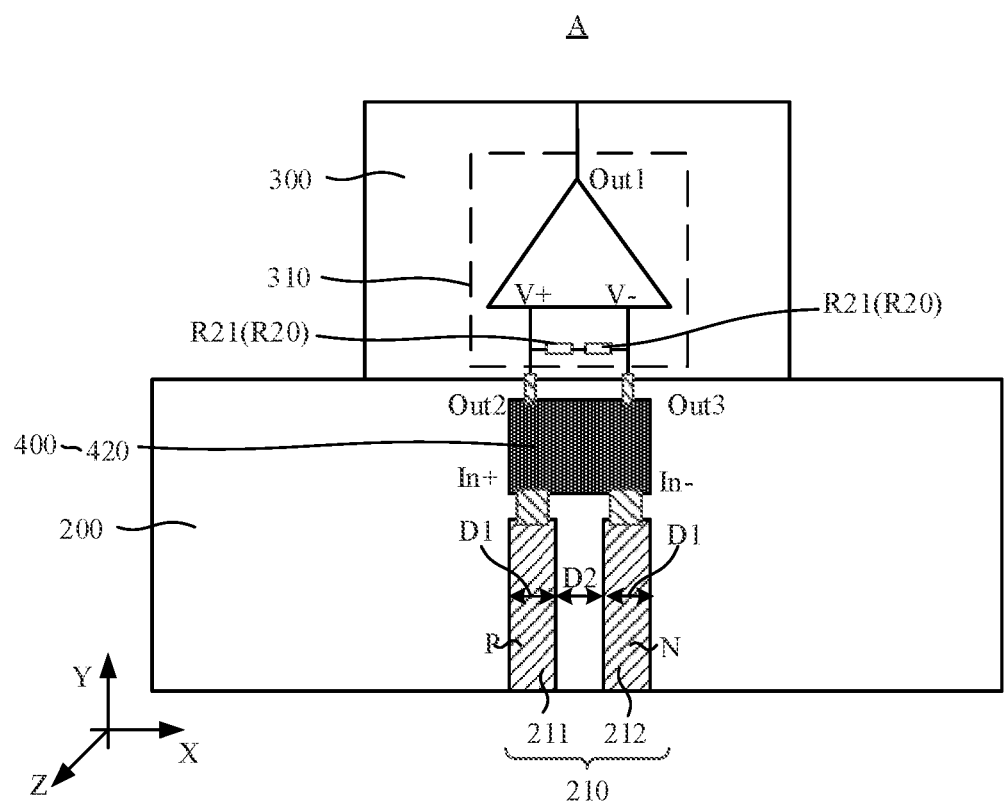
FIG. 4 is another partial enlargement view of the region A in FIG. 2.

In order to solve the above technical problems, the display module 1100 provided in embodiments of the present disclosure includes the buffer devices 400, referring to FIG. 3 or FIG. 4. Buffer devices 400 are arranged on the bonding circuit board 200, and a buffer device 400 is connected to ends, proximate to the chip-on-film 300, of the P-polarity differential sub-line 211 and the N-polarity differential sub-line 212, and the buffer device 400 is configured to reduce signal reflection between the first differential line 210 and the chip-on-film 300.

In the display module 1100 provided in the embodiments of the disclosure, since the buffer device 400 is arranged at the ends, proximate to the chip-on-film 300, of the P-polarity differential sub-line 211 and the N-polarity differential sub-line 212, the buffer device 400 is capable of reducing the signal reflection between the first differential line 210 and the chip-on-film 300. In this way, it may reduce a risk of the reflection of the differential signal during the transmission of the differential signal from the first differential line 210 to the chip-on-film 300, improve the reliability of signal transmissions, and reduce a risk of display abnormalities in the display panel 100.

In some embodiments, the buffer device 400 may include a first resistor 410 (as shown in FIG. 3) or a low-voltage differential signaling (LVDS) buffer 420 (as shown in FIG. 4). The first resistor 410 and the LVDS buffer 420 both are capable of reducing the risk of the signal reflection of the differential signal between the first differential line 210 and the chip-on-film 300.

In a case where the buffer device 400 includes the first resistor 410, referring to FIG. 3, an end of the first resistor 410 is connected to the P-polarity differential sub-line 211 and the other end is connected to the N-polarity differential sub-line 211. The first resistor 410 is equivalent to a signal receiving terminal, so that an impedance of an end of the first differential line 210 proximate to the chip-on-film 300 can be equivalent to a resistance of the first resistor 410. When the differential signal is transmitted to the end of the first differential line 210, the impedance of the line for transmitting the differential signal is equivalent to the resistance of the first resistor 410, i.e., the impedance changes from a value equal to the impedance of the first differential line 210 to a value equal to the resistance of the first resistor 41. In this way, a jump of the differential signal from low resistance to high resistance at the end of the first differential line proximate to the chip-on-film can be reduced by controlling the resistance of the first resistor 410, thereby reducing the risk of reflection of the differential signal, improving the transmission quality of the differential signal, and reducing the risk of poor display of the display panel.

In some embodiments, the resistance of the first resistor 410 is substantially equal to the impedance of the first differential line 210. Thus, when the differential signal is transmitted at the end of the first differential line 210 proximate to the chip-on-film 300, the impedance of the signal transmission line is not changed, and the risk of the reflection of the differential signal can be effectively reduced.

For example, in the embodiments of the present disclosure, the impedance of the first differential line 210 is 100Ω. In a case where the impedance of the first differential line 210 is 100Ω, the resistance of the first resistor 410 is 100Ω.

In some embodiments, the first resistor 410 may be a chip resistor The chip resistor may also be referred to as a chip fixed resistor, which has a small volume and high reliability, and is advantageous for the connection of the first resistor 410 with the P-polarity differential sub-line 211 and the N-polarity differential sub-line 212 of the first differential line 210.

For example, a package size of the chip resistor may be less than or equal to a 0402 package size (the 0402 package size has a length of 0.04 inches and a width of 0.02 inches). For example, the package size of the chip resistor may be the 0402 package size (the length of 1.00±0.10 mm, the width of 0.50±0.10 mm, and a height of 0.30±0.10 mm), or may be a 0201 package size (the 0201 package size has a length of 0.024 inches and a width of 0.012 inches, i.e., the length of 0.60±0.05 mm, the width of 0.30±0.05 mm, and a height of 0.23±0.05 mm). Therefore, the chip resistor may have a small packaging size, and the P-polarity differential sub-line 211 and the N-polarity differential sub-line 212 of the first differential line 210 may have a small distance therebetween, thereby improving the anti-interference capability of the first differential line 210.

Referring to FIG. 4, in a case where the buffer device 400 includes the LVDS buffer 420, the LVDS buffer 420 includes a first input terminal In+, a second input terminal In−, a first output terminal Out2, and a second output terminal Out3. The chip-on-film 300 is connected to the first differential line 210 through the LVDS buffer 420. The first input terminal In+ may be connected to the P-polarity differential sub-line 211 of the first differential line 210, the second input terminal In− may be connected to the N-polarity differential sub-line 212 of the first differential line 210, and the first output terminal Out2 and the second output terminal Out3 are both connected to the chip-on-film 300.

For example, in a case that the chip-on-film 300 includes the LVDS interface circuit 310, referring to FIG. 4, the first output terminal Out2 may be electrically connected to the first signal receiving terminal V+, and the second output terminal Out3 may be connected to the second signal receiving terminal V−.

In some embodiments, the resistance of the second resistor R20 is substantially equal to the impedance of the first differential line 210, and the second resistor R20 includes two sub-resistors R21 connected in series, where the two sub-resistors R21 have a same resistance. For example, in the case where the impedance of the first differential line 210 is 100Ω, the resistance of the second resistor R20 is 100Ω, where a resistance of each sub-resistor R21 is 50Ω. Based on this, a bias voltage signal may be applied to a line between the two sub-resistors R21 depending on actual requirements to adjust the differential signal, and the embodiments of the disclosure do not specifically limit the setting of the bias voltage.

Figure 5:
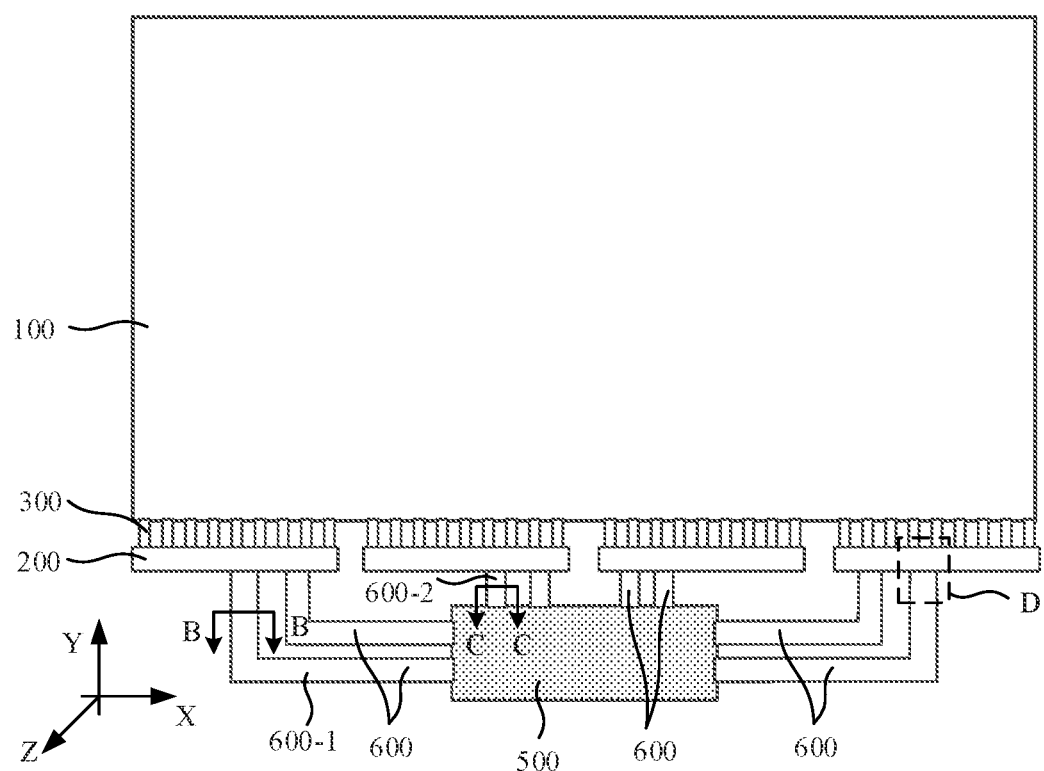
FIG. 5 is a structural diagram of another display module, in accordance with some embodiments.

In some embodiments, referring to FIG. 5, the display module 1100 may include a plurality of bonding circuit boards 200, and the plurality of bonding circuit boards 200 are arranged at intervals along a first direction X (a horizontal direction in FIG. 5). The first direction X is parallel to a side edge of the display panel 100 (a lower side edge of the display panel 100 in FIG. 5) where the plurality of bonding circuit boards 200 are located.

According to the magnitude of a size of the display panel 100, a number of the bonding circuit boards 200 included in the display module 1100 may be flexibly set depending on actual requirements. For example, referring to FIG. 5, the display module may include four bonding circuit boards 200.

The display module 1100 further includes a driving circuit board 500 (timing controller (TCON) circuit board) and a plurality of flexible connectors 600. The driving circuit board 500 is configured to output differential signals.

For example, the driving circuit board 500 may include a timing controller TCON, and the timing controller TCON is configured to output the differential signals. For example, the differential signals may be CEDS signals.

Each bonding circuit board 200 is connected to the driving circuit board 500 through at least one flexible connector 600. For example, as shown in FIG. 5, each bonding circuit board 200 may be electrically connected to the driving circuit board 500 through two flexible connectors 600. One of the flexible connectors 600 is configured to transmit a differential signal, and the other flexible connector 600 (referring to the sixth flexible connector 600F below) is configured to transmit other signals such as a power signal or a GOA signal.

Figure 6:
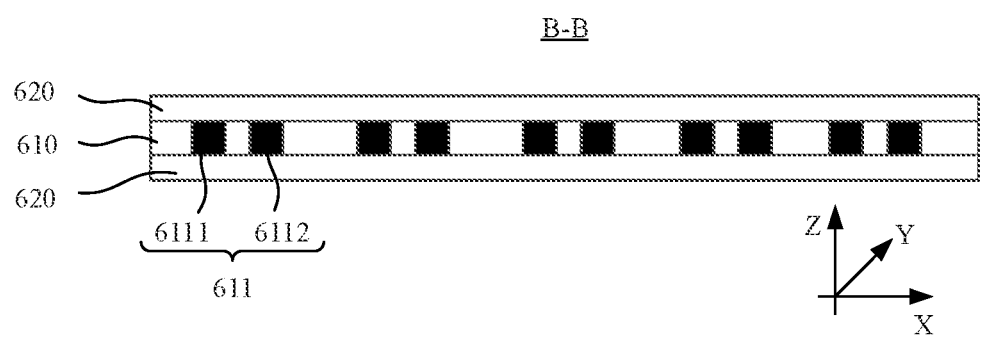
FIG. 6 is a sectional view taken along the section line B-B in FIG. 5.
Figure 7:
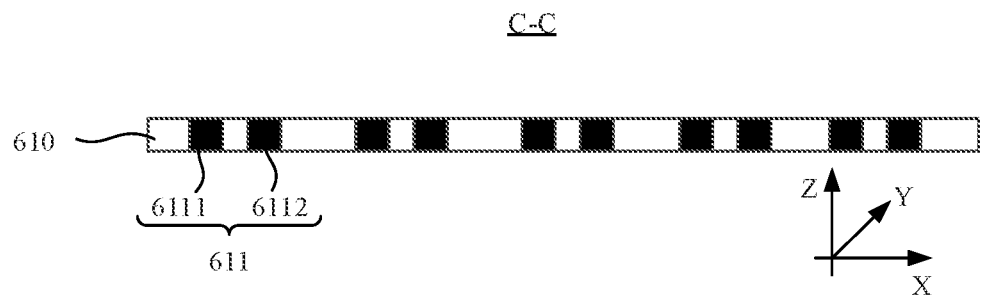
FIG. 7 is a sectional view taken along the section line C-C in FIG. 5.
Figure 10:
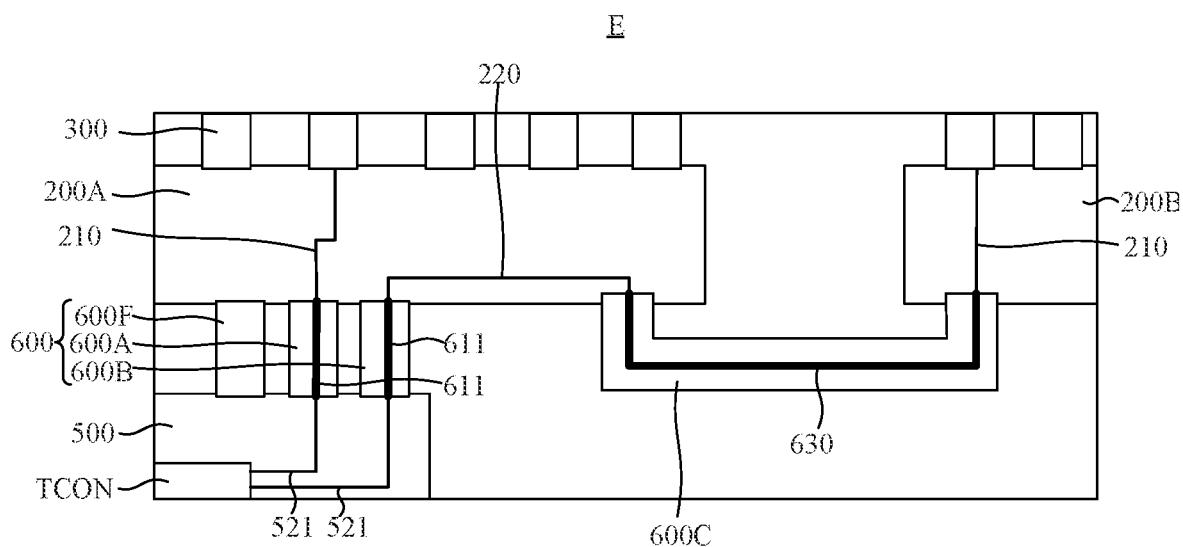
FIG. 10 is a partial enlargement view of the region E in FIG. 9.

Referring to FIGS. 6 and 7, the flexible connector 600 includes a wiring layer 610, and the wiring layer 610 includes second differential lines 611. An end of a second differential line 611 is connected to the driving circuit board 500, and the other end is connected to the first differential line 210 (as shown in FIG. 10).

For example, the second differential line 611 includes a second P-polarity differential sub-line 6111 and a second N-polarity differential sub-line 6112, the second P-polarity differential sub-line 6111 is electrically connected to the P-polarity differential sub-line (may be regarded as a first P-polarity differential sub-line) 211 of the first differential sub-line 210, and the second N-polarity differential sub-line 6112 is electrically connected to the N-polarity differential sub-line (may be regarded as a first N-polarity differential sub-line) 212 of the first differential line 210.

In some embodiments, the flexible connector 600 may include at least one of a flexible flat cable (FFC) and a flexible printed circuit (FPC) board. For example, the flexible connector 600 includes an FFC.

It can be understood that the plurality of flexible connectors 600 may be all FFC s, or all FPC boards, or include multiple FFCs and multiple FPC boards, which is not specifically limited by the embodiments of the present disclosure. For example, the plurality of flexible connectors 600 are all FFCs.

As the size of the display panel 100 increases, a length of the flexible connector 600 also increases. A differential signal transmitted by the second differential lines 611 in the flexible connector 600 is more susceptible to interference, and is prone to signal attenuation, which may result in the differential signal transmitted to the chip-on-film 300 not being received by the chip-on-film 300 or not being correctly identified.

In order to solve the above problems, in some embodiments, referring to FIG. 6, at least one flexible connector 600 further includes at least one shielding layer 620. The shielding layer 620 refers to a film layer capable of shielding external signal interference, and may be, for example, a mesh copper layer.

Along a thickness direction (third direction Z) of the wiring layer 610, the at least one shielding layer 620 is arranged on at least one side of the wiring layer 610. For example, both sides of the wiring layer 610 each are provided with a shielding layer 620 thereon. The shielding layer 620 covers the second differential lines 611, so that the shielding layer 620 is capable of shielding external signals and reducing an interference of the external signals on the differential signals on the second differential line 611.

Of course, in some embodiments, referring to FIG. 7, there may be at least one flexible connector 600 without a shielding layer 620. Referring to FIG. 5, a length of a flexible connector 600-1 provided with a shielding layer 620 is greater than a length of a flexible connector 600-2 without a shielding layer 620.

It can also be understood that, in a case where a length of a flexible connector 600 is greater than a preset value, the flexible connector 600 may include a shielding layer 620 to reduce interference of the external signals on the differential signal on the second differential line 611; while in a case where a length of a flexible connector 600 is less than the preset value, the flexible connector 600 may not be provided with a shielding layer. For example, by considering an example in which the flexible connector 600 is an FFC, the preset value may go from 300 mm to 500 mm, inclusive. For example, the preset value may be 300 mm. i.e., in a case where the length of the FFC is greater than or equal to 300 mm, the FFC may include the shielding layer 620; conversely, in a case where the length of the FFC is less than 300 mm, the FFC may not be provided with the shielding layer 620. For example, the preset value may be 400 mm, 450 mm or 500 mm, and embodiments of the present disclosure are not listed one by one.

Figure 8:
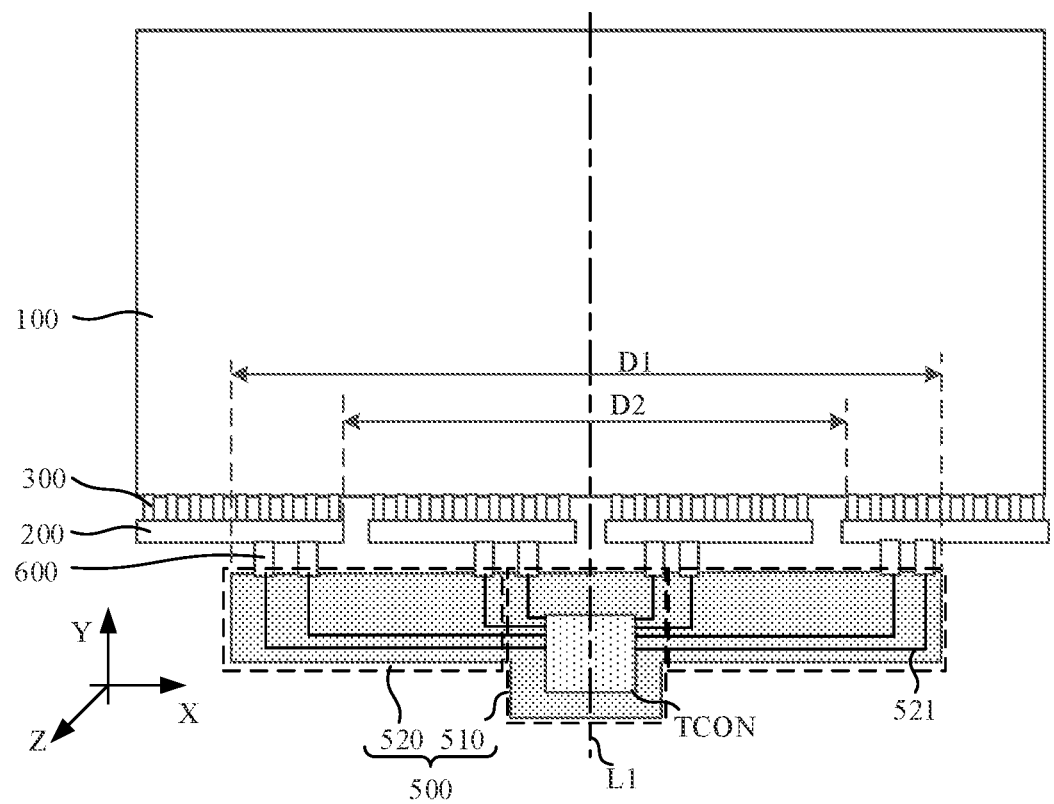
FIG. 8 is a structural diagram of yet another display module, in accordance with some embodiments.

In some embodiments, in order to reduce the length of the flexible connector 600, and reduce the attenuation of the differential signal on the second differential line 611 of the flexible connector 600, referring to FIG. 8, a dimension D1, along the first direction X, of the driving circuit board 500 is greater than a distance D2, along the first direction X, between two bonding circuit boards 200 of the plurality of bonding circuit boards 200 at both ends; and along a second direction Y, at least a portion of each bonding circuit board 200 is opposite to the driving circuit board 500. The first direction X is perpendicular to the second direction Y.

The portion of the bonding circuit board 200 opposite to the driving circuit board 500 is connected to the driving circuit board 500 through at least one flexible connector 600. In this way, by setting the driving circuit board 500 to be of a special-shaped structure (irregular structure) and increasing the size of the driving circuit board 500 along the first direction X, sizes of flexible connectors 600 connected between the driving circuit board 500 and a bonding circuit board 200 at each of the both ends may be reduced, thereby reducing the attenuation of the differential signal on the second differential line 611 of the flexible connector 600.

It can be understood that for signal lines with a same length, an attenuation degree of the differential signal on the driving circuit board 500 and the bonding circuit board 200 is less than an attenuation degree of the differential signal on the flexible connector (FFC) 600.

In some embodiments, lengths of the plurality of flexible connectors 600 are substantially equal. That is, a side edge of the driving circuit board 500 proximate to the display panel 100 is substantially parallel to the first direction X, which is beneficial to improving the uniformity of differential signals received by different chip-on-films 300, and improving the commonality of the flexible connector 600, so as to facilitate the assembly of the display module 1100.

For example, referring to FIG. 8, an extension direction of a length of the flexible connector 600 is substantially parallel to the second direction Y. It can be understood that the extension direction of the length of the flexible connector 600 is parallel to an extension direction of the second differential line 611.

In some embodiments, referring to FIG. 8, the driving circuit board 500 includes a main body portion 510 and extension portions 520 located at two opposite sides of the main body portion 510 along the first direction X, and dimensions of the extension portions 520 along the second direction Y each are less than a dimension of the main body portion 510 along the second direction Y. The driving circuit board 500 includes a timing controller TCON arranged on the main body portion 510, the timing controller TCON configured to output differential signals. The dimension of the extension portion 520 along the second direction Y is less than the dimension of the main body portion 510 along the second direction Y, facilitating the mounting of the timing controller TCON.

For example, the extension portion 520 is provided with third differential lines 521 thereon, an end of a third differential line 521 is connected to the timing controller TCON, and the other end is connected to a second differential line 611 of a flexible connector 600, so that a differential signal output by the timing controller TCON is transmitted to the LVDS interface circuit 310 (not shown in the figure) of the chip-on-film 300 through the third differential line 521, the second differential line 611 and the first differential line 210 in sequence.

Figure 9:
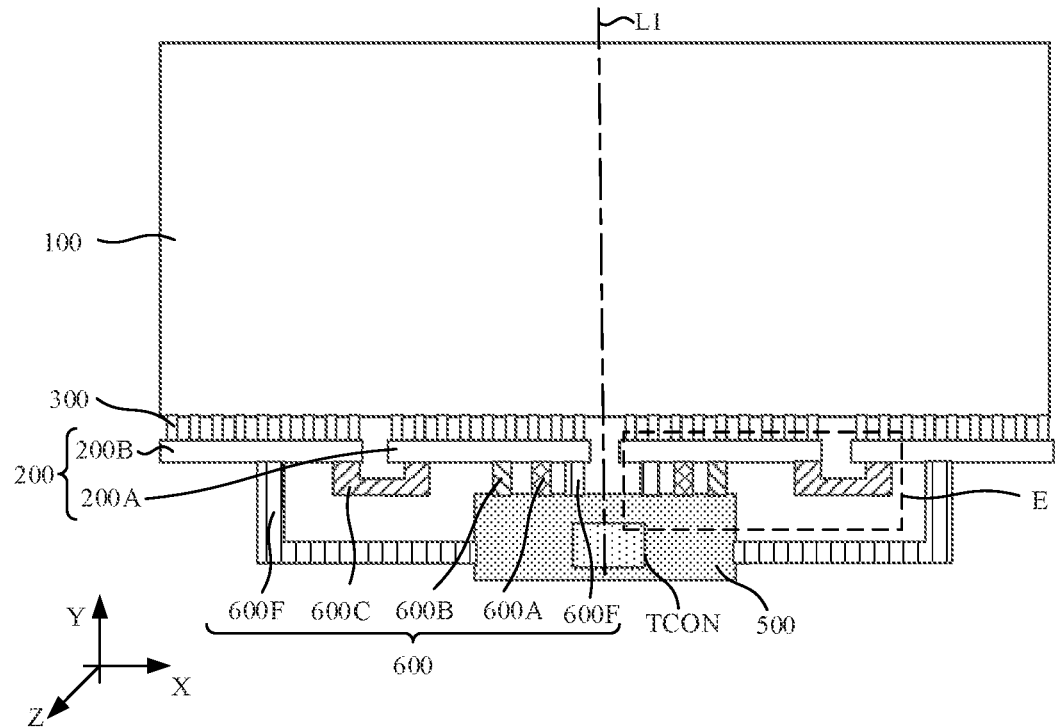
FIG. 9 is a structural diagram of yet another display module, in accordance with some embodiments.

In some embodiments, to reduce an attenuation degree of the differential signal on the flexible connector 600, referring to FIG. 9, the plurality of bonding circuit boards 200 include first bonding circuit board(s) 200A and second bonding circuit board(s) 200B which are arranged adjacent to each other. Along the second direction Y, at least a portion of a first bonding circuit board 200A is opposite to the driving circuit board 500, and a second bonding circuit board 200B is staggered from the driving circuit board 500. The first direction X and the second direction Y are perpendicular to each other.

That is, a dimension of the driving circuit board 500 along the first direction X is less than a distance between two bonding circuit boards 200 at both ends; and along the second direction Y, some of the bonding circuit boards 200 opposite to driving circuit board 500 are referred to as first bonding circuit boards 200A, and some of the bonding circuit boards 200 staggered from driving circuit board 500 are referred to as second bonding circuit boards 200B.

For example, as shown in FIG. 9, the display module 1100 includes four bonding circuit boards 200; along the first direction X, two bonding circuit boards 200 located in the middle are first bonding circuit boards 200A and two bonding circuit boards 200 located on both sides are second bonding circuit boards 200B.

The plurality of flexible connectors 600 include first flexible connector(s) 600A, second flexible connector(s) 600B, and third flexible connector(s) 600C.

The first bonding circuit board 200A is connected to the driving circuit board 500 through a first flexible connector 600A and a second flexible connector 600B. The first flexible connector 600A is configured to transmit a differential signal required by a chip-on-film 300 connected to the first bonding circuit board 200A, and the second flexible connector 600B is configured to transmit a differential signal required by a chip-on-film 300 connected to the second bonding circuit board 200B.

An end of a third flexible connector 600C is connected to the first bonding circuit board 200A and the other end is connected to the second bonding circuit board 200B. The differential signal transmitted by the second flexible connector 600C is transmitted to the second bonding circuit board 200B through the first bonding circuit board 200A and the third flexible connector 600C in sequence.

Referring to FIG. 10, only some of the signal lines, not all of the signal lines, are exemplarily shown in FIG. 10 for the sake of example.

The first bonding circuit board 200A includes a first differential line 210 and a first transition line 220, and the third flexible connector 600C includes a second transition line 630.

An end of the first differential line 210 of the first bonding circuit board 200A is connected to the first flexible connector 600A (the second differential line 611), and the other end is connected to the chip-on-film 300 connected to the first bonding circuit board 200A.

An end of the first transition line 220 is connected to the second flexible connector 600B, and the other end is connected to an end of the second transition line 630. The other end of the second transition line 630 is connected to a first differential line 210 of the second bonding circuit board 200B.

The first differential line 210 of the second bonding circuit board 200B is connected to the other end of the second transition line 630. Thus, the differential signal, which is sent by the driving circuit board 500 and is required by the chip-on-film 300 connected to the second bonding circuit board 200B, is transmitted to the first differential line 210 of the second bonding circuit board 200B through the second flexible connector 600B (the second differential line 611), the first transition line 220 of the first bonding circuit board 200A, and the second transition line 630 of the third flexible connector 600C in sequence, and then is transmitted to the chip-on-film 300 connected to the second bonding circuit board 200B.

Thus, a length of a transmission path of the differential signal required by the second bonding circuit board 200B on the flexible connector 600 may be reduced by the way in which the first bonding circuit board 200A transfers the differential signal required by the second bonding circuit board 200B, thereby reducing the attenuation degree of the differential signal.

Figure 11:
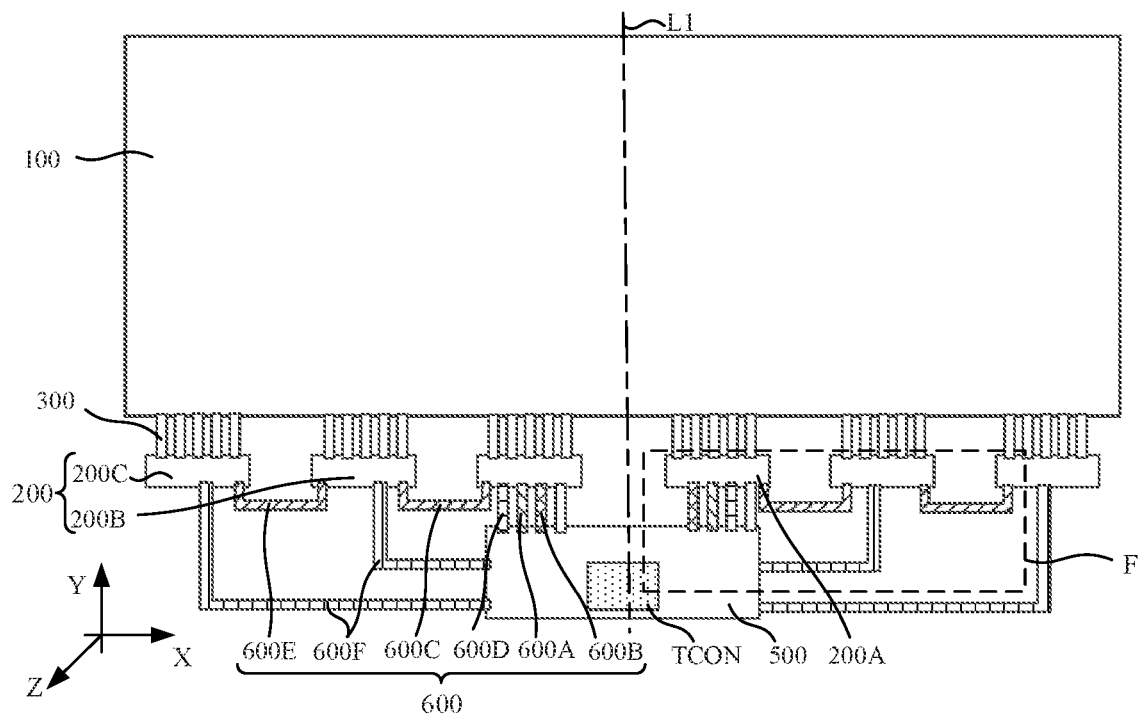
FIG. 11 is a structural diagram of yet another display module, in accordance with some embodiments.

In some embodiments, referring to FIG. 11, the plurality of bonding circuit boards 200 further include third bonding circuit board(s) 200C each arranged adjacent to a second bonding circuit board 200B, and the third bonding circuit board 200C is located on a side of second bonding circuit board 200B away from the first bonding circuit board 200A. That is, a bonding circuit board of the plurality of bonding circuit boards 200, which is located on the side of the second bonding circuit board 200B away from the first bonding circuit board 200A is the third bonding circuit board 200C. Along the second direction Y, the third bonding circuit board 200C is staggered from the driving circuit board 500.

For example, as shown in FIG. 11, the plurality of bonding circuit boards 200 further include two third bonding circuit boards 200C, and along the first direction X, the two third bonding circuit boards 200C are located at the both ends of the plurality of bonding circuit boards 200.

The plurality of flexible connectors 600 further include fourth flexible connector(s) 600D and fifth flexible connector(s) 600E.

An end of a fourth flexible connector 600D is connected to the first bonding circuit board 200A, and the other end is connected to the driving circuit board 500. The fourth flexible connector 600D is configured to transmit a differential signal required by a chip-on-film 300 connected to the third bonding circuit board 200C.

An end of fifth flexible connector 600E is connected to second bonding circuit board 200B and the other end is connected to third bonding circuit board 200C. The differential signal transmitted by the fourth flexible connector 600D is transmitted to the third bonding circuit board 200C through the first bonding circuit board 200A, the third flexible connector 600C, the second bonding circuit board 200B, and the fifth flexible connector 600E in sequence.

Figure 12:
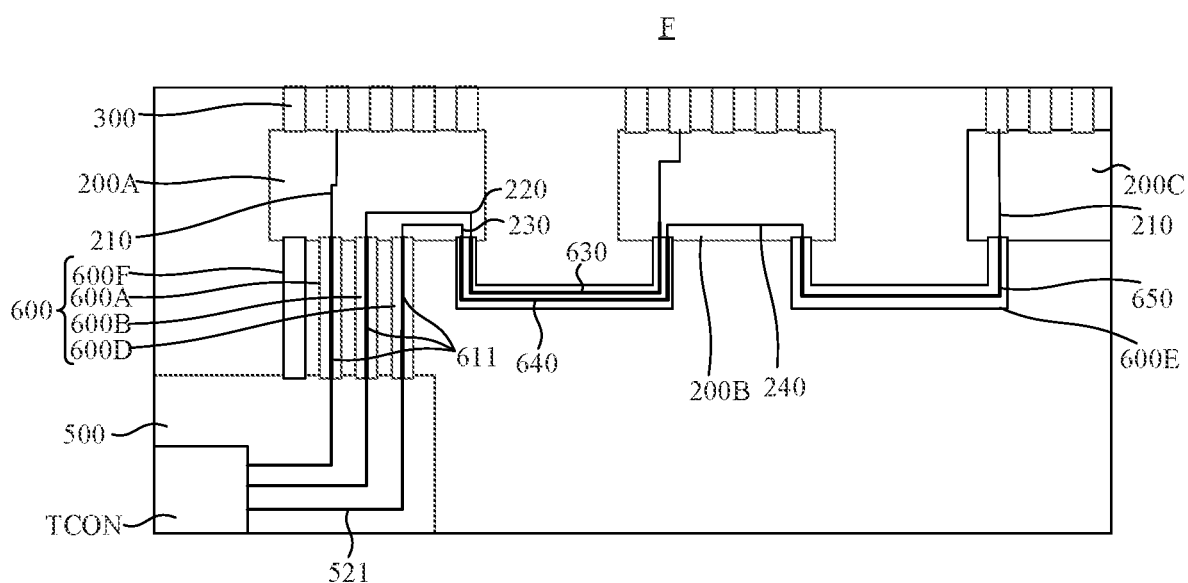
FIG. 12 is a partial enlargement view of the region F in FIG. 11.

For example, referring to FIG. 12, the first bonding circuit board 200A includes a third transition line 230, the third flexible connector 600C includes a fourth transition line 640, the second bonding circuit board 200B includes a fifth transition line 240, and the fifth flexible connector 600E includes a sixth transition line 650. In FIG. 12, only some of signal lines, not all of the signal lines, of the bonding circuit boards 200 and the flexible connectors 600 are exemplarily shown.

The third transition line 230, the fourth transition line 640, the fifth transition line 240, and the sixth transition line 650 are connected in sequence, the third transition line 230 is further connected to the fourth flexible connector 600D, and the sixth transition line 650 is further connected to the third bonding circuit board 200C.

Thus, the differential signal, which is sent by the driving circuit board 500 and is required by the chip-on-film 300 connected to the third bonding circuit board 200C, is transmitted to the first differential line 210 of the third bonding circuit board 200C through the fourth flexible connector 600D (the second differential line 611), the third transition line 230 of the first bonding circuit board 200A, the fourth transition line 640 of the third flexible connector 600C, the fifth transition line 240 of the second bonding circuit board 200B, and the sixth transition line 650 of the fifth flexible connector 600E in sequence, and then is transmitted to the chip-on-film 300 connected to the third bonding circuit board 200C.

Similar to the above embodiments, a length of a transmission path of the differential signal required by the third bonding circuit board 200C on flexible connectors 600 may be reduced in these embodiments by the way in which the bonding circuit boards and the flexible connectors transfer the differential signal required by the third bonding circuit board 200C, thereby reducing the attenuation degree of the differential signal.

It can be understood that as the number of the bonding circuit boards 200 increases, flexible connector(s) 600 may be added in a similar manner, that is, a differential signal required by a bonding circuit board 200 at the edge of the bonding circuit boards is transmitted to this bonding circuit boards 200 through a bonding circuit board 200 at the middle thereof and flexible connector 600 between adjacent bonding circuit boards 200 in sequence.

In some embodiments, referring to FIG. 9, in a case where the display module includes the first flexible connector 600A and the second flexible connector 600B, a length (a dimension along the second direction Y) of the first flexible connector 600A is equal to a length (a dimension along the second direction Y) of the second flexible connector 600B, and/or an extension direction of the length of the first flexible connector 600A and an extension direction of the length of the second flexible connector 600B are substantially parallel to the second direction Y. In this way, the lengths of the first flexible connector 600A and the second flexible connector 600B can be reduced to the greatest extent, so as to reduce a length of a transmission path of differential signals on the first flexible connector 600A and the second flexible connector 600B, and reduce the attenuation degree of the differential signals.

As shown in FIG. 11, in a case where the display module includes the first flexible connector 600A, the second flexible connector 600B, and the fourth flexible connector 600D, lengths of the first flexible connector 600A, the second flexible connector 600B, and the fourth flexible connector 600D are equal, and/or extending directions of the lengths of the first flexible connector 600A, the second flexible connector 600B, and the fourth flexible connector 600D are substantially parallel to the second direction Y. In this way, the lengths of the first flexible connector 600A, the second flexible connector 600B and the fourth flexible connector 600D can be reduced to the greatest extent, so as to reduce lengths of transmission paths of differential signals on the first flexible connector 600A, the second flexible connector 600B and the fourth flexible connector 600D, and reduce the attenuation degree of the differential signals.

In some embodiments, referring to FIG. 9, the display module 1100 includes a plurality of first bonding circuit boards 200A, a plurality of second bonding circuit boards 200B, a plurality of first flexible connectors 600A, a plurality of second flexible connectors 600B, and a plurality of third flexible connectors 600C. In this case, the plurality of first bonding circuit boards 200A are symmetrically arranged with respect to a center line L1 of the display panel 100 along the second direction Y, the plurality of second bonding circuit boards 200B are symmetrically arranged with respect to the center line L1 of the display panel 100 along the second direction Y, the plurality of first flexible connectors 600A are symmetrically arranged with respect to the center line L1 of the display panel 100 along the second direction Y, the plurality of second flexible connectors 600B are symmetrically arranged with respect to the center line L1 of the display panel 100 along the second direction Y, and the plurality of third flexible connectors 600C are symmetrically arranged with respect to the center line L1 of the display panel 100 along the second direction Y.

In a case where the display module further includes a plurality of third bonding circuit boards 200C, a plurality of fourth flexible connectors 600D, and a plurality of fifth flexible connectors 600E, the plurality of third bonding circuit boards 200C are symmetrically arranged with respect to the center line L1 of the display panel 100 along the second direction Y, the plurality of fourth flexible connectors 600D are symmetrically arranged with respect to the center line L1 of the display panel 100 along the second direction Y, and the plurality of fifth flexible connectors 600E are symmetrically arranged with respect to the center line L1 of the display panel 100 along the second direction Y.

Thus, a distance between a bonding circuit board 200, which is farthest from the driving circuit board 500, and the driving circuit board 500 may be reduced, and the length of the transmission path of the differential signal may be reduced.

In some embodiments, the plurality of flexible connectors 600 further include a plurality of sixth flexible connectors 600F, each bonding circuit board 200 is connected to the driving circuit board 500 through one of the sixth flexible connectors 600F, and the sixth flexible connector 600F includes a trace for transmitting a power signal. The power signal has a strong capability of resisting signal interference, so a length of the sixth flexible connector 600F does not need to be specially reduced, and a structure of the display module 1100 is further simplified.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
a display panel;
at least one bonding circuit board, each including first differential lines, wherein a first differential line includes a P-polarity differential sub-line and an N-polarity differential sub-line;
a plurality of chip-on-films, wherein an end of a chip-on-film is connected to the first differential line, and an other end of the chip-on-film is connected to the display panel; and
a plurality of buffer devices, arranged on the bonding circuit board, wherein a buffer device is connected to ends, proximate to the chip-on-film, of the P-polarity differential sub-line and the N-polarity differential sub-line, and the buffer device is configured to reduce signal reflection between the first differential line and the chip-on-film; wherein
the chip-on-film includes a low-voltage differential signaling (LVDS) interface circuit, the LVDS interface circuit includes a first signal receiving terminal, a second signal receiving terminal, a signal output terminal and a second resistor, wherein
the first signal receiving terminal is connected to the P-polarity differential sub-line, the second signal receiving terminal is connected to the N-polarity differential sub-line, and the signal output terminal is connected to the display panel; an end of the second resistor is connected to the first signal receiving terminal, and an other end of the second resistor is connected to the second signal receiving terminal.

2. The display module according to claim 1, wherein the buffer device includes a first resistor, an end of the first resistor is connected to the P-polarity differential sub-line, and an other end of the first resistor is connected to the N-polarity differential sub-line.

3. The display module according to claim 2, wherein the first resistor satisfies one or more of:
that a resistance of the first resistor is substantially equal to an impedance of the first differential line;
that a value of the resistance of the first resistor is 100 ohms ($\Omega$); and
that the first resistor includes a chip resistor, and a package size of the chip resistor is less than or equal to a 0402 package size.

4. The display module according to claim 1, wherein the buffer device includes a low-voltage differential signaling (LVDS) buffer, and the LVDS buffer includes a first input terminal, a second input terminal, a first output terminal and a second output terminal; the chip-on-film is connected to the first differential line through the LVDS buffer, wherein
the first input terminal is connected to the P-polarity differential sub-line, the second input terminal is connected to the N-polarity differential sub-line, and the first output terminal and the second output terminal are connected to the chip-on-film.

5. The display module according to claim 1, wherein a distance between the P-polarity differential sub-line and the N-polarity differential sub-line is less than or equal to a line width of each of the P-polarity differential sub-line and the N-polarity differential sub-line.

6. The display module according to claim 1, wherein a resistance of the second resistor is substantially equal to an impedance of the first differential line; and the second resistor includes two sub-resistors connected in series, and resistances of the two sub-resistors are equal.

7. The display module according to claim 1, wherein the display module comprises a plurality of bonding circuit boards, the plurality of bonding circuit boards are arranged at intervals along a first direction, and the first direction is parallel to a side edge of the display panel where the plurality of bonding circuit boards are located;
the display module further comprises:
a driving circuit board, configured to output differential signals; and
a plurality of flexible connectors, each bonding circuit board being connected to the driving circuit board through one or more flexible connectors, wherein
the plurality of flexible connectors each include a wiring layer, the wiring layer includes second differential lines, an end of a second differential line is connected to the driving circuit board, and an other end of the second differential line is connected to the first differential line.

8. The display module according to claim 7, wherein in at least one flexible connector, each flexible connector further includes: at least one shielding layer, arranged on at least one side of a wiring layer included in the flexible connector along a thickness direction of the wiring layer, wherein the shielding layer covers second differential lines included in the wiring layer.

9. The display module according to claim 8, wherein another at least one flexible connector each are not provided with a shielding layer therein, and a length of a flexible connector provided with a shielding layer is greater than a length of a flexible connector not provided with a shielding layer.

10. The display module according to claim 7, wherein a dimension, along the first direction, of the driving circuit board is greater than a distance, along the first direction, between two bonding circuit boards of the plurality of bonding circuit boards at both ends; along a second direction, at least a portion of each bonding circuit board is opposite to the driving circuit board, and the first direction is perpendicular to the second direction; and
the portion of each bonding circuit board opposite to the driving circuit board is connected to the driving circuit board through the one or more flexible connectors.

11. The display module according to claim 10, wherein lengths of the plurality of flexible connectors are substantially equal; and/or
an extension direction of a length of the flexible connector is substantially parallel to the second direction.

12. The display module according to claim 10, wherein the driving circuit board includes a main body portion and extension portions located at two opposite sides of the main body portion along the first direction, and dimensions of the extension portions along the second direction each are less than a dimension of the main body portion along the second direction; and the driving circuit board further includes a timing controller, arranged on the main body portion and configured to output the differential signals.

13. The display module according to claim 7, wherein the plurality of bonding circuit boards include a first bonding circuit board and a second bonding circuit board arranged adjacent to each other; along a second direction, at least a portion of the first bonding circuit board is opposite to the driving circuit board, and the second bonding circuit board is staggered from the driving circuit board; the first direction is perpendicular to the second direction; and
the plurality of flexible connectors include a first flexible connector, a second flexible connector, and a third first flexible connector, wherein
the first bonding circuit board is connected to the driving circuit board through the first flexible connector and the second flexible connector; the first flexible connector is configured to transmit a differential signal required by a chip-on-film connected to the first bonding circuit board, and the second flexible connector is configured to transmit a differential signal required by a chip-on-film connected to the second bonding circuit board; and
an end of a third flexible connector is connected to the first bonding circuit board, and an other end of the third flexible connector is connected to the second bonding circuit board; and the differential signal transmitted by the second flexible connector is transmitted to the second bonding circuit board through the first bonding circuit board and the third flexible connector in sequence.

14. The display module according to claim 13, wherein the first bonding circuit board includes the first differential line and a first transition line, and the third flexible connector includes a second transition line, wherein
an end of the first differential line is connected to the first flexible connector, and an other end of the first differential line is connected to the chip-on-film connected to the first bonding circuit board; and
an end of the first transition line is connected to the second flexible connector, and an other end of the first transition line is connected to the second transition line.

15. The display module according to claim 13, wherein the plurality of bonding circuit boards further include a third bonding circuit board arranged adjacent to the second bonding circuit board, and the third bonding circuit board is located on a side of the second bonding circuit board away from the first bonding circuit board; along the second direction, the third bonding circuit board is staggered with the driving circuit board; and
the plurality of flexible connectors further include a fourth flexible connector and a fifth flexible connector, wherein
an end of the fourth flexible connector is connected to the first bonding circuit board, and an other end of the fourth flexible connector is connected to the driving circuit board; the fourth flexible connector is configured to transmit a differential signal required by a chip-on-film connected to the third bonding circuit board; and
an end of the fifth flexible connector is connected to the second bonding circuit board, and an other end of the fifth flexible connector is connected to the third bonding circuit board; the differential signal transmitted by the fourth flexible connector is transmitted to the third bonding circuit board through the first bonding circuit board, the third flexible connector, the second bonding circuit board and the fifth flexible connector in sequence.

16. The display module according to claim 15, wherein the first bonding circuit board includes a third transition line, the third flexible connector includes a fourth transition line, the second bonding circuit board includes a fifth transition line, and the fifth flexible connector includes a sixth transition line, wherein
the third transition line, the fourth transition line, the fifth transition line and the sixth transition line are connected in sequence, the third transition line is further connected to the fourth flexible connector, and the sixth transition line is further connected to the third bonding circuit board.

17. The display module according to claim 13, wherein a length of the first flexible connector is equal to a length of the second flexible connector, and/or an extension direction of the length of the first flexible connector and an extension direction of the length of the second flexible connector are substantially parallel to the second direction;
in a case where the display module further comprises a fourth flexible connector, the length of the first flexible connector, the length of the second flexible connector, and a length of the fourth flexible connector are equal, and/or the extension direction of the length of the first flexible connector, the extension direction of the length of the second flexible connector, and an extension direction of the length of the fourth flexible connector are substantially parallel to the second direction; and/or
the plurality of flexible connectors further include a plurality of sixth flexible connectors, each bonding circuit board is connected to the driving circuit board through a sixth flexible connector, and the sixth flexible connector is configured to transmit a power signal.

18. The display module according to claim 7, wherein the display module comprises a plurality of first bonding circuit boards, a plurality of second bonding circuit boards, a plurality of first flexible connectors, a plurality of second flexible connectors, and a plurality of third flexible connectors; the plurality of first bonding circuit boards are symmetrically arranged with respect to a center line of the display panel along a second direction, the plurality of second bonding circuit boards are symmetrically arranged with respect to the center line of the display panel along the second direction, the plurality of first flexible connectors are symmetrically arranged with respect to the center line of the display panel along the second direction, the plurality of second flexible connectors are symmetrically arranged with respect to the center line of the display panel along the second direction, and the plurality of third flexible connectors are symmetrically arranged with respect to the center line of the display panel along the second direction; the first direction is perpendicular to the second direction;
in a case where the display module further comprises a plurality of third bonding circuit board, a plurality of fourth flexible connector, and a plurality of fifth flexible connector, the plurality of third bonding circuit board are symmetrically arranged with respect to the center line of the display panel along the second direction, the plurality of fourth flexible connector are symmetrically arranged with respect to the center line of the display panel along the second direction, and the plurality of fifth flexible connector are symmetrically arranged with respect to the center line of the display panel along the second direction.

19. A display device, comprising the display panel according to claim 1.

20. A display module, comprising:
a display panel;
at least one bonding circuit board, each including first differential lines, wherein a first differential line includes a P-polarity differential sub-line and an N-polarity differential sub-line;
a plurality of chip-on-films, wherein an end of a chip-on-film is connected to the first differential line, and an other end of the chip-on-film is connected to the display panel; and
a plurality of buffer devices, arranged on the bonding circuit board, wherein a buffer device is connected to ends, proximate to the chip-on-film, of the P-polarity differential sub-line and the N-polarity differential sub-line, and the buffer device is configured to reduce signal reflection between the first differential line and the chip-on-film; wherein
the buffer device includes a low-voltage differential signaling (LVDS) buffer, and the LVDS buffer includes a first input terminal, a second input terminal, a first output terminal and a second output terminal; the chip-on-film is connected to the first differential line through the LVDS buffer, wherein
the first input terminal is connected to the P-polarity differential sub-line, the second input terminal is connected to the N-polarity differential sub-line, and the first output terminal and the second output terminal are connected to the chip-on-film.

* * * * *